United States Patent
Hwang et al.

(10) Patent No.: US 8,023,318 B2
(45) Date of Patent: Sep. 20, 2011

(54) RESISTANCE MEMORY ELEMENT, PHASE CHANGE MEMORY ELEMENT, RESISTANCE RANDOM ACCESS MEMORY DEVICE, INFORMATION READING METHOD THEREOF, PHASE CHANGE RANDOM ACCESS MEMORY DEVICE, AND INFORMATION READING METHOD THEREOF

(75) Inventors: Cheol-Seong Hwang, Seongnam-si (KR); Tae-Joo Park, Jungnang-gu (KR)

(73) Assignee: SNU R&DB Foundation, Seoul (KR)

( * ) Notice: Subject to any disclaimer, the term of this patent is extended or adjusted under 35 U.S.C. 154(b) by 287 days.

(21) Appl. No.: 12/397,299

(22) Filed: Mar. 3, 2009

(65) Prior Publication Data

US 2010/0008132 A1   Jan. 14, 2010

(30) Foreign Application Priority Data

Jul. 8, 2008 (KR) .................. 10-2008-0066120

(51) Int. Cl.
*G11C 11/00* (2006.01)
(52) U.S. Cl. ....................... 365/163; 365/158
(58) Field of Classification Search .................. 365/163, 365/158
See application file for complete search history.

(56) References Cited

U.S. PATENT DOCUMENTS

| | | | | |
|---|---|---|---|---|
| 6,198,682 B1* | 3/2001 | Proebsting | ................. | 365/207 |
| 7,184,301 B2* | 2/2007 | Sugibayashi et al. | ......... | 365/158 |
| 7,630,234 B2* | 12/2009 | Sugibayashi et al. | ......... | 365/171 |
| 7,636,251 B2* | 12/2009 | Park et al. | ................... | 365/148 |
| 2003/0117835 A1* | 6/2003 | Kim et al. | ................... | 365/158 |
| 2003/0117838 A1* | 6/2003 | Hidaka | ....................... | 365/171 |
| 2003/0218207 A1* | 11/2003 | Hashimoto et al. | ........... | 257/315 |
| 2004/0114443 A1* | 6/2004 | Ezaki et al. | .................... | 365/200 |
| 2005/0232006 A1* | 10/2005 | Iwata | ............................. | 365/171 |
| 2006/0043595 A1* | 3/2006 | Aratani et al. | ................ | 257/758 |
| 2007/0187801 A1* | 8/2007 | Asao et al. | .................... | 257/613 |
| 2007/0195590 A1* | 8/2007 | Sugita | ............................. | 365/163 |
| 2008/0130352 A1* | 6/2008 | Scheuerlein | ................. | 365/163 |

* cited by examiner

*Primary Examiner* — Michael Tran
(74) *Attorney, Agent, or Firm* — Sherr & Vaughn, PLLC

(57) ABSTRACT

A resistance memory element, a phase change memory element, a resistance random access memory device, an information reading method thereof, a phase change random access memory device, and an information reading method thereof are provided. The resistance random access memory device includes an array of resistance memory element arranged in a matrix. Each resistance memory element includes a substrate in which a source region and a drain region are formed along the column direction and a channel region is formed between the source region and the drain region, a bit line formed on the channel region out of a conductive material to have a shape extending along the arrangement direction of the columns, a resistance switching layer formed on the bit line out of a material of which electrical resistance is switched by an electrical signal, and a word line formed on the resistance switching layer out of a conductive material to have a shape extending along the row direction.

24 Claims, 8 Drawing Sheets

RESISTANCE MEMORY ELEMENT, PHASE CHANGE MEMORY ELEMENT, RESISTANCE RANDOM ACCESS MEMORY DEVICE, INFORMATION READING METHOD THEREOF, PHASE CHANGE RANDOM ACCESS MEMORY DEVICE, AND INFORMATION READING METHOD THEREOF

CROSS-REFERENCE TO RELATED PATENT APPLICATION

This application claims the benefit of Korean Patent Application No. 10-2008-0066120, filed on Jul. 8, 2008, in the Korean Intellectual Property Office, the disclosure of which is incorporated herein in its entirety by reference.

BACKGROUND

1. Technical Field

The present invention relates to a non-volatile memory device, and more particularly, to a resistance random access memory device and a phase change random access memory device.

2. Related Art

With recent brilliant development of the information communication industry, a need for various memory devices has increased. Particularly, memory devices for mobile terminals and MP3 players require a non-volatile property that written data is not erased even when it is turned off. Since the non-volatile memory devices can electrically store and erase data and can store data even with no power, applications thereof have increased in various fields. However, a known dynamic random access memory (DRAM) formed of semiconductor has a volatile property that stored information is erased with no power, and thus non-volatile memory devices to be replaced for the DRAM have been studied.

As a representative non-volatile memory device, a flash memory device having an electrically-isolated floating gate was actively studied in the past. However, a magnetic RAM (MRAM) using a magnetic resistance changing phenomenon, a ferroelectric RAM (FRAM) using a spontaneous polarization phenomenon of ferroelectrics, a resistance RAM (ReRAM) using a resistance switching or conductivity switching phenomenon of a metal oxide film, and a phase change RAM (PRAM) using a phase change phenomenon were studied as the non-volatile memory devices in recent years. Particularly, the resistance random access memory and the phase change random access memory have a relatively simple structure and a relatively simple manufacturing process in comparison with the other non-volatile memory devices and thus have attracted much attention.

The resistance RAM exhibits a characteristic that oxide is switched from a high resistance state (HRS) to a low resistance state (LRS) when an electrical signal is applied to a basic element structure of metal-oxide-metal. The oxide is switched from the LRS to the HRS with another electrical signal. It is called "set" that the oxide is switched from the HRS to the LRS. On the contrary, it is called "reset" that the oxide is switched from the LRS to the HRS. The set state means the LRS and the reset state means the HRS. Information is written to and read from the resistance RAM by the use of the switching of resistance.

The phase change RAM includes a transistor and a storage node. The storage node has a structure in which a lower electrode, a phase change layer, and an upper electrode are sequentially stacked and the transistor is used as a switching element. When the phase change layer of the phase change RAM is crystalline, it corresponds to the LRS. When the phase change layer is amorphous, it corresponds to the HRS. It is called "set" that the phase change layer is changed from the HRS to the LRS, that is, that the phase change layer is changed from the amorphous state to the crystalline state. On the contrary, it is called "reset" that the phase change layer is changed from the LRS to the HRS, that is, that the phase change layer is changed from the crystalline state to the amorphous state. As described above, the set state means the LRS and the reset state means the HRS.

When elements exhibiting the resistance switching phenomenon are integrated using a transistor as a switching element like the known DRAM, the resistance RAM has a structure very similar to the phase change RAM. However, because of the deterioration in performance of the transistors with the increase in degree of integration, a cross bar array structure is more preferable than the above-mentioned structure.

The known resistance RAM is shown in FIG. 1A. As shown in FIG. 1A, the known resistance RAM 100 has a structure in which resistance memory elements 140 having a resistance switching layer 120 disposed between electrodes 110 and 130 perpendicular to each other are arranged in a matrix. For example, information of "1" and "0" is stored depending on the resistance state of the resistance switching layer 120 of each resistance memory element 140, that is, the LRS and the HRS, respectively.

The writing and reading of information to and from the resistance memory element 140 will be described now. In order to write information to a selected resistance memory element 140, voltages for switching the resistance switching layer 120 to the LRS or the HRS are applied to the electrodes 110 and 130 of the selected resistance memory element 140. In order to read information therefrom, reading voltages are applied to the electrodes 110 and 130 of the selected resistance memory element 140 and current flowing in one electrode 110 or 130 is measured. That is, when the magnitude of current is relatively great, it corresponds to "1" as the LRS. When the magnitude of current is relatively small, it corresponds to "0" as the HRS.

When information is read from the resistance Ram 100, there is a problem that the information is influenced by the resistance state of the resistance switching layer of another resistance memory element in addition to the resistance state of the resistance switching layer 120 of the resistance memory element 140 selected to read information therefrom. Such a problem is shown in FIG. 1B.

The reading of information from the resistance memory element 151 having the resistance switching layer 121 in the HRS will be described now. In order to read information, a reading voltage should be applied across the electrodes 111 and 131 of the selected resistance memory element 151. For example, 0 V as a reference voltage is applied to the electrode 111 and $V_{read}$ as a reading voltage is applied to the electrode 131. Current flows in the direction of an arrow 170 and information is read by measuring the value of the current. When the resistance switching layer 121 of the selected resistance memory element 151 is in the HRS, the measured current value should be relatively small, which can be said that the information is correctly read.

When the voltages are applied in the above-mentioned method, current also flows in the direction of an arrow 180, in addition to the arrow 170. In this case, as shown in FIG. 1B, when the resistance switching layers 122, 123, and 124 of the peripheral resistance memory elements 152, 153, and 154 are in the LRS, the value of current flowing in the direction of the arrow 180 is greater than the value of current flowing in the direction of the arrow 170. Accordingly, the resistance switching layer 121 of the selected resistance memory element 151 is in the HRS but the relatively great value of current may be measured to read the information as the LRS.

Similarly to the resistance RAM, the above-mentioned problem with the erroneous reading of information occurs in the phase change RAM.

SUMMARY

An advantage of some aspects of the invention is to provide a resistance memory element, a phase change memory element, a resistance random access memory device, and an information reading method thereof, a phase change random access memory device, and an information reading method thereof.

According to an aspect of the invention, there is provided a resistance memory element including: a substrate in which a channel region is formed between a source region and a drain region; a bit line formed on the channel region out of a conductive material; a resistance switching layer formed on the bit line out of a material of which electrical resistance is switched by an electrical signal; and a word line formed on the resistance switching layer out of a conductive material.

According to another aspect of the invention, there is provided a phase change memory element including: a substrate in which a channel region is formed between a source region and a drain region; a bit line formed on the channel region out of a conductive material; a phase changing layer formed on the bit line out of a material of which a phase is changed by an electrical signal; and a word line formed on the phase changing layer out of a conductive material.

According to another aspect of the invention, there is provided a resistance random access memory device that is an array of resistance memory elements arranged in a matrix, each resistance memory element including: a substrate in which a source region and a drain region are formed along the column direction and a channel region is formed between the source region and the drain region; a bit line formed on the channel region out of a conductive material to have a shape extending along the arrangement direction of the columns; a resistance switching layer formed on the bit line out of a material of which electrical resistance is switched by an electrical signal; and a word line formed on the resistance switching layer out of a conductive material to have a shape extending along the row direction. Here, each resistance memory element shares the source region, the drain region, and the bit line with the resistance memory element adjacent thereto in the arrangement direction of the columns and shares the work line with the resistance memory element adjacent thereto in the arrangement direction of the rows to form the array.

According to still another aspect of the invention, there is provided a phase change random access memory device that is an array of phase change memory elements arranged in a matrix, each phase change memory element including: a substrate in which a source region and a drain region are formed along the column direction and a channel region is formed between the source region and the drain region; a bit line formed on the channel region out of a conductive material to have a shape extending along the arrangement direction of the columns; a phase change layer formed on the bit line out of a material of which a phase is changed by an electrical signal; and a word line formed on the phase change layer out of a conductive material to have a shape extending along the row direction. Here, each phase change memory element shares the source region, the drain region, and the bit line with the phase change memory element adjacent thereto in the arrangement direction of the columns and shares the work line with the phase change memory element adjacent thereto in the arrangement direction of the rows to form the array.

According to still another aspect of the invention, there is provided an information reading method of a resistance random access memory device that is an array of resistance memory elements arranged in a matrix, each resistance memory element including: a substrate in which a source region and a drain region are formed along the column direction and a channel region is formed between the source region and the drain region; a bit line formed on the channel region out of a conductive material to have a shape extending along the arrangement direction of the columns; a resistance switching layer formed on the bit line out of a material of which electrical resistance is switched by an electrical signal; and a word line formed on the resistance switching layer out of a conductive material to have a shape extending along the row direction, wherein each resistance memory element shares the source region, the drain region, and the bit line with the resistance memory element adjacent thereto in the arrangement direction of the columns and shares the work line with the resistance memory element adjacent thereto in the arrangement direction of the rows to form the array. The information reading method includes: preparing the resistance random access memory device in which the source region of each resistance memory element and the drain regions of the resistance memory elements adjacent thereto in the arrangement direction of the rows are electrically isolated from each other; assigning "1" to the resistance memory element of which the resistance switching layer is in a set state and assigning "0" to the resistance memory element of which the resistance switching layer is in a reset state; on the basis of a voltage applied to the source region of the resistance memory element selected to read information therefrom, applying a gate voltage to the word line of the selected resistance memory element and the bit lines not belonging to the selected resistance memory element, applying a drain voltage to the drain region of the selected resistance memory element, and floating the bit line of the selected resistance memory element and the word lines not belonging to the selected resistance memory element; and measuring current flowing in the drain region of the selected resistance memory element to read "0" or "1" assigned to the selected resistance memory element.

According to still another aspect of the invention, there is provided an information reading method of a resistance random access memory device that is an array of resistance memory elements arranged in a matrix, each resistance memory element including: a substrate in which a source region and a drain region are formed along the column direction and a channel region is formed between the source region and the drain region; a bit line formed on the channel region out of a conductive material to have a shape extending along the arrangement direction of the columns; a resistance switching layer formed on the bit line out of a material of which electrical resistance is switched by an electrical signal; and a word line formed on the resistance switching layer out of a conductive material to have a shape extending along the row direction, wherein each resistance memory element shares the source region, the drain region, and the bit line with the resistance memory element adjacent thereto in the arrangement direction of the columns and shares the work line with the resistance memory element adjacent thereto in the arrangement direction of the rows to form the array. Here, the information reading method includes: preparing the resistance random access memory device in which the source region of each resistance memory element and the drain regions of the resistance memory elements adjacent thereto in the arrangement direction of the rows are formed in a bundle and shared with each other; assigning "1" to the resistance memory element of which the resistance switching layer is in a set state and assigning "0" to the resistance memory element of which the resistance switching layer is in a reset state; on the basis of a voltage applied to the source region of the resistance memory element selected to read information therefrom, applying a gate voltage to the word line of the selected resistance memory element and the bit lines not belonging to the selected resistance memory element, applying a drain voltage to the drain region of the selected resistance memory element and the drain region of the resistance memory element sharing as the source region the drain region of the selected resistance memory element, and floating the bit line of the selected resistance memory element and the word lines not belonging to the selected resistance memory element; and measuring current flowing in the drain region of the selected resistance memory element to read "0" or "1" assigned to the selected resistance memory element.

According to still another aspect of the invention, there is provided an information reading method of a phase change random access memory device that is an array of phase change memory elements arranged in a matrix, each phase change memory element including: a substrate in which a source region and a drain region are formed along the column direction and a channel region is formed between the source region and the drain region; a bit line formed on the channel region out of a conductive material to have a shape extending along the arrangement direction of the columns; a phase change layer formed on the bit line out of a material of which a phase is changed by an electrical signal; and a word line formed on the phase change layer out of a conductive material to have a shape extending along the row direction, wherein each phase change memory element shares the source region, the drain region, and the bit line with the phase change memory element adjacent thereto in the arrangement direction of the columns and shares the work line with the phase change memory element adjacent thereto in the arrangement direction of the rows to form the array. Here, the information reading method includes: preparing the phase change random access memory device in which the source region of each phase change memory element and the drain regions of the phase change memory elements adjacent thereto in the arrangement direction of the rows are electrically isolated from each other; assigning "1" to the phase change memory element of which the phase change layer is in a set state and assigning "0" to the phase change memory element of which the phase change layer is in a reset state; on the basis of a voltage applied to the source region of the phase change memory element selected to read information therefrom, applying a gate voltage to the word line of the selected phase change memory element and the bit lines not belonging to the selected phase change memory element, applying a drain voltage to the drain region of the selected phase change memory element, and floating the bit line of the selected phase change memory element and the word lines not belonging to the selected phase change memory element; and measuring current flowing in the drain region of the selected phase change memory element to read "0" or "1" assigned to the selected phase change memory element.

According to still another aspect of the invention, there is provided an information reading method of a phase change random access memory device phase change random access memory device that is an array of phase change memory elements arranged in a matrix, each phase change memory element including: a substrate in which a source region and a drain region are formed along the column direction and a channel region is formed between the source region and the drain region; a bit line formed on the channel region out of a conductive material to have a shape extending along the arrangement direction of the columns; a phase change layer formed on the bit line out of a material of which a phase is changed by an electrical signal; and a word line formed on the phase change layer out of a conductive material to have a shape extending along the row direction, wherein each phase change memory element shares the source region, the drain region, and the bit line with the phase change memory element adjacent thereto in the arrangement direction of the columns and shares the work line with the phase change memory element adjacent thereto in the arrangement direction of the rows to form the array. Here, the information reading method includes: preparing the phase change random access memory device in which the source region of each phase change memory element and the drain regions of the phase change memory elements adjacent thereto in the arrangement direction of the rows are formed in a bundle and shared with each other; assigning "1" to the phase change memory element of which the phase change layer is in a set state and assigning "0" to the phase change memory element of which the phase change layer is in a reset state; on the basis of a voltage applied to the source region of the phase change memory element selected to read information therefrom, applying a gate voltage to the word line of the selected phase change memory element and the bit lines not belonging to the selected phase change memory element, applying a drain voltage to the drain region of the selected phase change memory element and the drain region of the phase change memory device sharing as the source region the drain region of the selected phase change memory element, and floating the bit line of the selected phase change memory element and the word lines not belonging to the selected phase change memory element; and measuring current flowing in the drain region of the selected phase change memory element to read "0" or "1" assigned to the selected phase change memory element.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, a resistance memory element, a phase change memory element, a resistance random access memory device, an information reading method thereof, a phase change random access memory device, and an information reading method thereof according to exemplary embodiments of the invention will be described in detail with reference to the accompanying drawings. The invention is not limited to the exemplary embodiments, but may be modified in various forms. The exemplary embodiments are provided to complete the disclosure of the invention and to completely inform those skilled in the art of the scope of the invention.

Figure 1A:
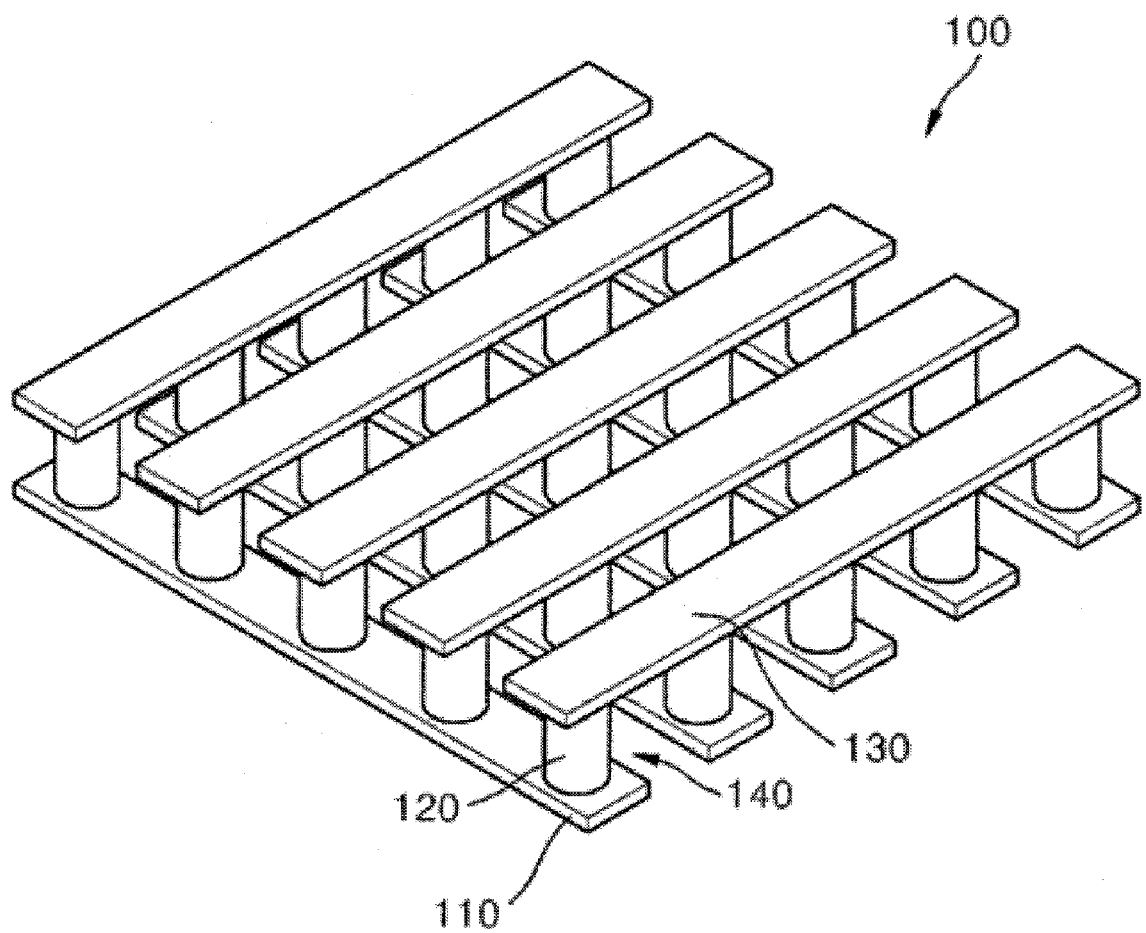
FIG. 1A is a perspective view schematically illustrating a structure of a known resistance RAM.
Figure 1B:
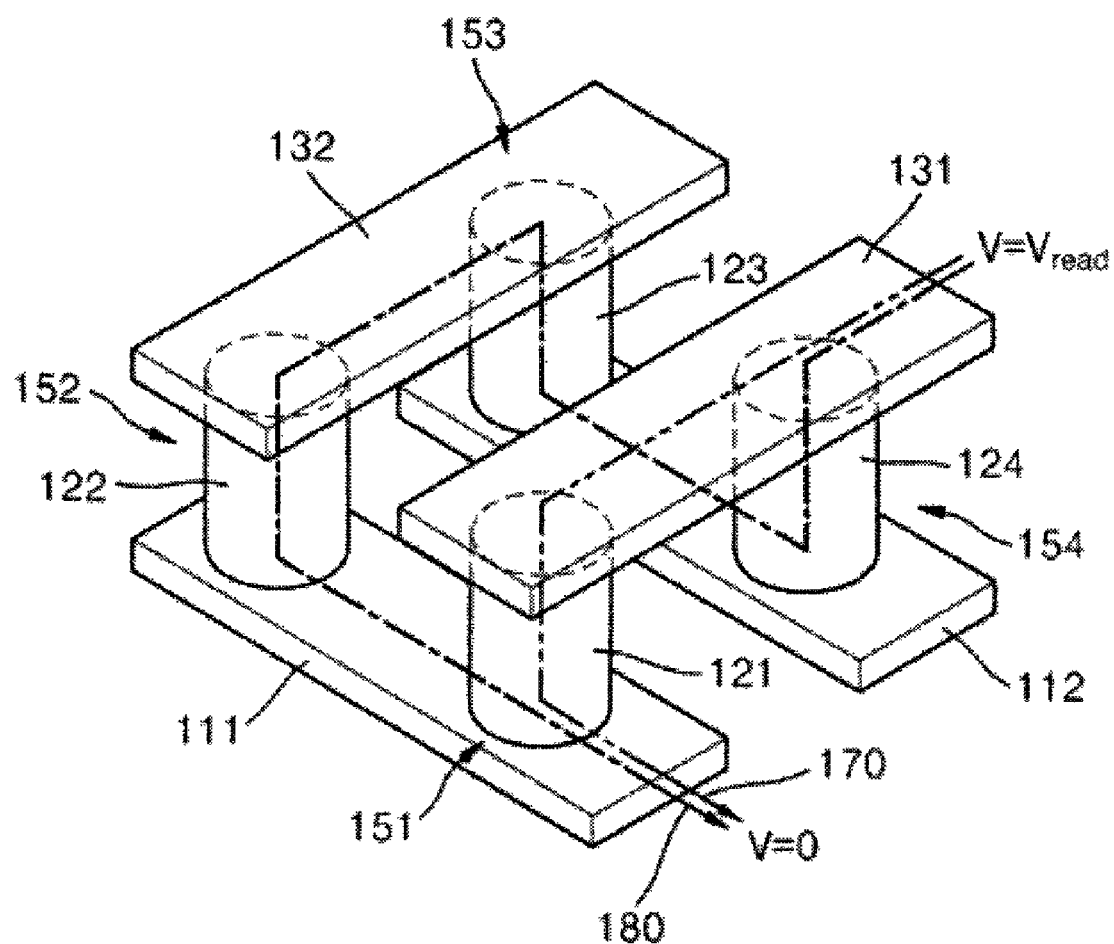
FIG. 1B is a diagram schematically illustrating an erroneous information reading process in the known resistance RAM.
Figure 2:
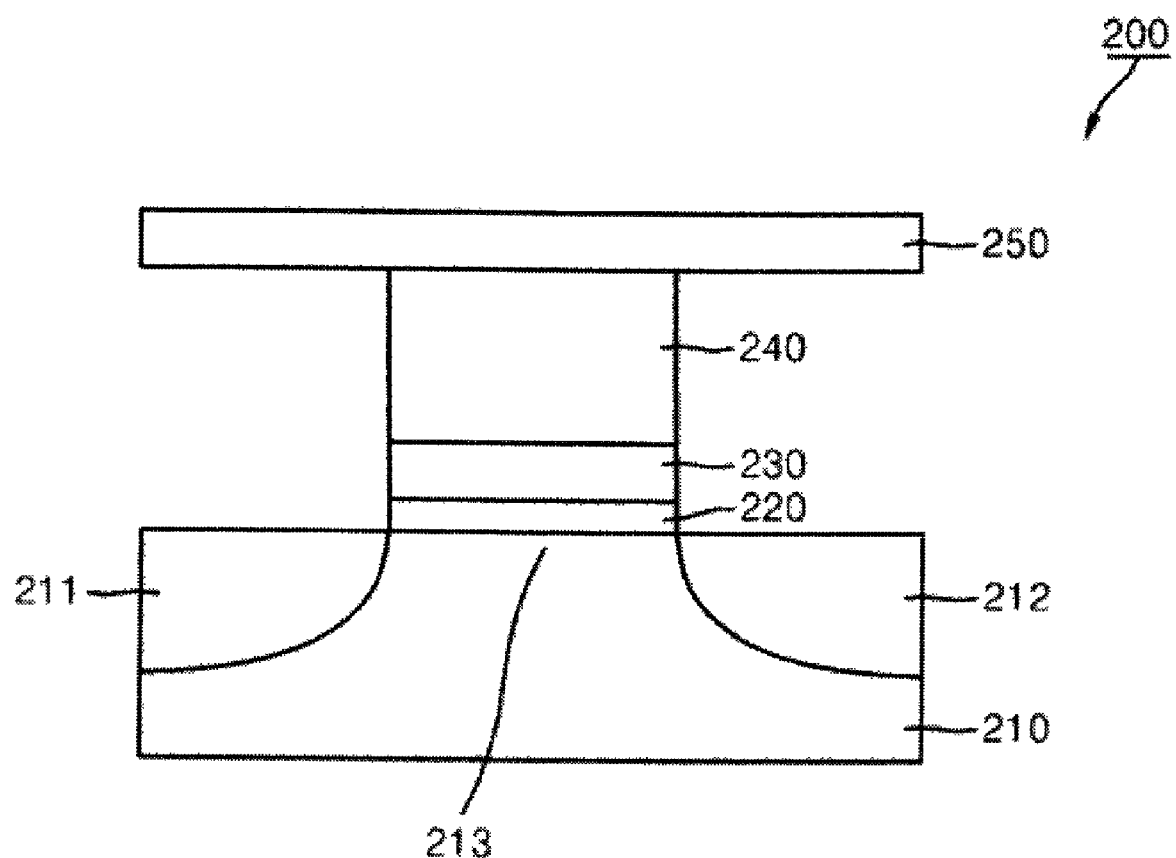
FIG. 2 is a sectional view schematically illustrating a structure of a resistance RAM according to an embodiment of the invention.
Figure 3:
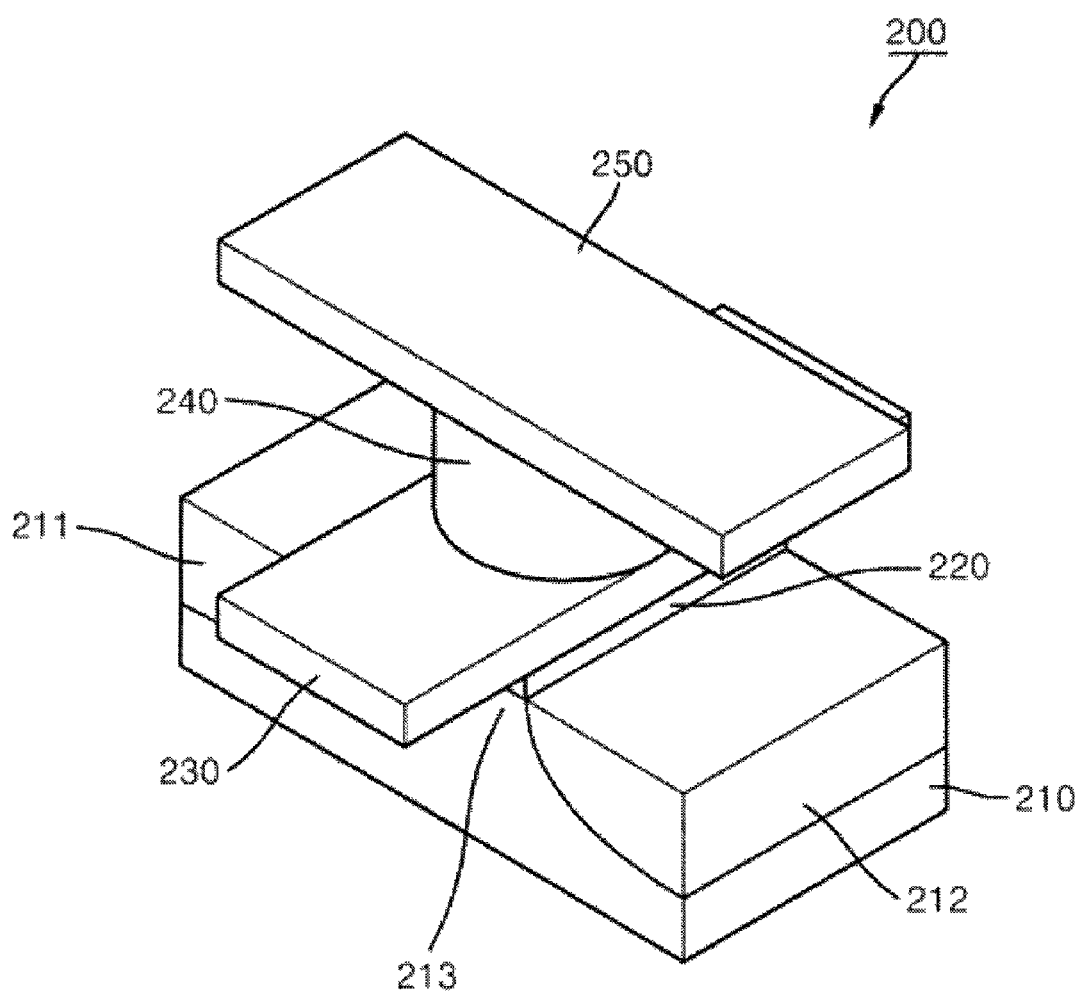
FIG. 3 is a perspective view of FIG. 2.

FIG. 2 is a sectional view schematically illustrating a structure of a resistance RAM according to an embodiment of the invention. FIG. 3 is a perspective view of FIG. 2.

Referring to FIGS. 2 and 3, a resistance memory element 200 according to the embodiment of the invention includes a substrate 210, an insulating layer 220, a bit line 230, a resistance switching layer 240, and a word line 250.

The substrate 210 is formed of one selected from a group consisting of Si, Ge, C, Ga, As, P, B, Zn, Se, S, Cd, Sn, Al, In, SiGe, GaAs, AlGaAs, GaAsP, InAs, Sn, InAsP, InGaAs, AlAs, InP, GaP, ZnSe, CdS, ZnCdS, CdSe, and combinations thereof, and is preferably formed of a monocrystalline silicon substrate. A source region 211 and a drain region 212 are formed in the substrate 210, and a channel region 213 is formed between the source region 211 and the drain region 212.

The insulating layer 220 is formed on the channel region 213 of the substrate 210 to perform the same function as a gate oxide layer of a field effect transistor and is formed of an insulating material such as SiO2.

The bit line 230 is formed on the insulating layer 220 to extend in a direction and is formed of a conductive material. The bit line 230 is formed of one of metal materials such as Pt, Ru, Ir, Ag, Al, W, and TiN and oxide conductive materials such as $IrO_2$, $RuO_2$, $SrRuO_3$, $CaRuO_3$, $LaSrCoO_3$, $LaNiO_3$, and $InSnO_x$ (ITO) or combinations thereof.

The resistance switching layer 240 is formed on the bit line 230 out of a material of which the electrical resistance varies depending on an electrical signal. An example of the material of which the electrical resistance varies depending on an electrical signal includes perovskite, transition metal oxide, and chalcogenide materials. The resistance switching layer 240 is formed of one of two-component materials such as $TiO_2$, NiO, $HfO_2$, $Al_2O_3$, $ZrO_2$, ZnO, $Ta_2O_5$, and $Nb_2O_5$ and three-component materials such as $SrTiO_3$, HfAlO, HfSiO, and HfTiO or combinations thereof. In addition, the resistance switching layer 240 may be formed of one of $SiO_2$ doped with Cu, $SiO_2$ doped with Ag, Ge—Se—Te compound doped with Cu, Ge—Se—Te compound doped with Ag, and $CuO_x$-based resistance switching material or combinations thereof.

The word line 250 is formed on the resistance switching layer 240 to extend in a direction perpendicular to the extending direction of the bit line 230 and is formed of a conductive material. Similarly to the bit line 230, the word line 250 is formed of one of metal materials such as Pt, Ru, Ir, Ag, Al, W, and TiN and oxide conductive materials such as $IrO_2$, $RuO_2$, $SrRuO_3$, $CaRuO_3$, $LaSrCoO_3$, $LaNiO_3$, and $InSnO_x$ (ITO) or combinations thereof and is preferably formed of the same material as the bit line 230.

A method of writing or reading information to and from the resistance memory element 200 will be described now.

To write information to the resistance memory element 200, the resistance switching layer 240 should be switched from a set state to a reset state. Accordingly, a voltage is applied across the word line 250 and the bit line 230. When the resistance switching layer 240 is in the reset state and a set voltage is applied across the word line 250 and the bit line 230, the resistance switching layer 240 is switched to the set state. When the resistance switching layer 240 is in the set state and a reset voltage is applied across the word line 250 and the bit line 230, the resistance switching layer 240 is switched to the reset state. "1" is assigned to the set state of the resistance switching layer 240 and "0" is assigned to the reset state of the resistance switching layer 240, whereby information is written to the resistance memory element 200.

The method of reading information stored in the resistance memory element 200 is performed by measuring current flowing in the drain region 212. The source region 211 is grounded, the bit line 230 is floated, the word line 250 is supplied with a gate voltage, and the drain region 212 is supplied with a drain voltage. At this time, the difference between the gate voltage and the drain voltage is set smaller than the reset voltage of the resistance switching layer 240 so as not to change the state of the resistance switching layer 240. The set voltage is greater than the reset voltage. Accordingly, if a voltage is smaller than the reset voltage, the voltage is also smaller than the set voltage. As a result, when the difference between the gate voltage and the drain voltage is smaller than the reset voltage of the resistance switching layer, the state of the resistance switching layer 240 is not switched.

Since the reset state of the resistance switching layer 240 means that the resistance switching layer 240 is in a high-resistance state, the voltage of the word line 250 is not transmitted to the bit line 230. Accordingly, the channel region 213 is not opened and thus current hardly flows in the drain region 212. On the contrary, since the set state of the resistance switching layer 240 means that the resistance switching layer 240 is in a low-resistance state, the voltage of the word line 250 is transmitted to the bit line 230. When the voltage of the word line 250 is transmitted to the bit line 230, the channel region 213 is opened and thus current flows in the drain region 212. At this time, by controlling the amount of electric charges of the channel region 213, large current can be made to flow in the drain region 212.

As described above, since a portion used to write information to the resistance switching element 200 and a portion used to read information thereof are separated from each other unlike the known memory element, the resistance memory element can be driven clearly. An ON/OFF current ratio can be enhanced by controlling the amount of electric charges of the channel region 213 at the time of reading information.

A phase change memory element according to an embodiment of the invention includes a substrate, an insulating layer, a bit line, a phase change layer, and a word line, similarly to the resistance memory element 200 shown in FIGS. 2 and 3. That is, in the phase change memory element, the resistance switching layer 240 in the resistance memory element 200 shown in FIGS. 2 and 3 is replaced with the phase change layer. The substrate, the insulating layer, the bit line, and the word line of the phase change memory element correspond to the substrate 210, the insulating layer 220, the bit line 230, and the word line 250 of the resistance memory element 200 shown in FIGS. 2 and 3, respectively.

The phase change layer is formed on the bit line out of a material of which a phase is changed depending on an electrical signal. That is, chalcogenide compound is used as the material of which the phase is changed to be crystalline or amorphous depending on predetermined current. An example of the chalcogenide compound of which the phase is changed includes two-component compound, three-component compound, and four-component compound including combinations of Ge, Te, Sb, In, Se, and Sn and compound doped with Bi. Preferably, the phase change layer is formed of one of $Ge_2Sb_2Te_5$ and $Ge_2Sb_2Te_5$ doped with nitrogen, oxygen, $SiO_2$, or $Bi_2O_3$ or a combination thereof.

A method of writing or reading information to and from the phase change memory element according to an embodiment of the invention is similar to the method of writing or reading information to and from the resistance memory element 200. That is, information is written by the use of the word line and the bit line and information is read by the use of the word line and the drain region.

Figure 4:
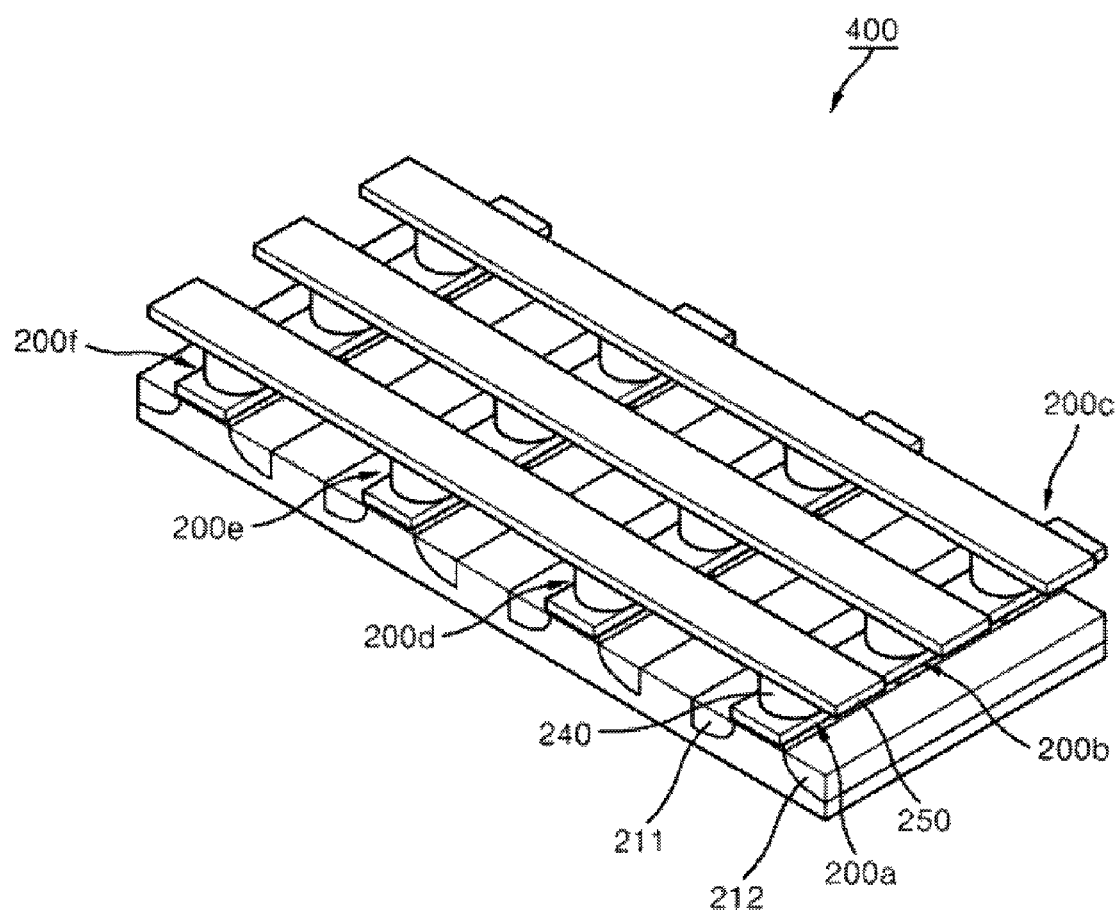
FIG. 4 is a view schematically illustrating a structure of the resistance RAM according to the embodiment of the invention.

FIG. 4 is a diagram schematically illustrating a structure of a resistance random access memory (hereinafter, referred to as resistance RAM) according to an embodiment of the invention.

Referring to FIG. 4, a resistance RAM 400 according to the embodiment of the invention has an array structure in which the resistance memory elements 200 shown in FIGS. 2 and 3 are arranged in a matrix of row and columns.

The resistance memory elements 200 are connected to each other through the source regions 211, the drain regions 212, the bit lines 230, and the word lines 250 formed on the substrate 210. The source regions 211 and the drain regions 212 are formed to extend in the column direction. The bit lines 230 are formed to extend in the column direction and the word lines 250 are formed to extend in the row direction.

Each resistance memory element shares the source region, the drain region, and the bit line with the resistance elements adjacent thereto in the column direction and shares the word line with the resistance memory elements adjacent thereto in the row direction, thereby forming an array structure. The source region of each resistance memory element is electrically separated from the drain regions of the resistance memory elements adjacent thereto in the row direction. For example, the source region 211, the drain region 212, and the bit line 230 of the resistance memory element denoted by reference numeral 200a are connected to the resistance memory elements denoted by reference numerals 200b and 200c. Accordingly, the resistance memory elements 200a, 200b, and 200c share the source region 211, the drain region 212, and the bit line 230 with each other. The word line 250 of the resistance memory element 200a is connected to the resistance memory elements denoted by reference numerals 200d, 200e, and 200f. Accordingly, the resistance memory elements 200a, 200d, 200e, and 200f share the word line 250 with each other. The source region 211 of the resistance memory element 200a is electrically separated from the drain region 214 of the resistance memory element 200d.

All the resistance memory elements 200 are preferably formed of the same material so that the characteristics of the resistance switching layers 240 of the resistance memory elements 200 are equal to each other. The resistance switching layers 240 are preferably formed so that the set voltages of all the resistance memory elements 200 are equal to each other and the resent voltages thereof are equal to each other.

A method of writing information to the resistance memory element 200a in the resistance RAM 400 will be described now.

In order to write information to the resistance memory element 200a selected to write information thereto, the resistance switching layer 240 of the selected resistance memory element 200a should be switched from the set state to the reset state or from the reset state to the set state. Accordingly, the set voltage or the reset voltage should be applied to the word line 250 and the bit line 230 of the selected resistance memory element 200a. When the resistance switching layer 240 of the selected resistance memory element 200a is in the reset state and the set voltage is applied across the word line 250 and the bit line 230 of the selected resistance memory element 200a, the resistance switching layer 240 of the selected resistance memory element 200a is switched to the set state. When the resistance switching layer 240 of the selected resistance memory element 200a is in the set state and the reset voltage is applied across the word line 250 and the bit line 230 of the selected resistance memory element 200a, the resistance switching layer 240 of the selected resistance memory element 200a is switched to the reset state. Information "1" is assigned to the set state of the resistance switching layer 240 of the selected resistance memory element 200a and information "0" is assigned to the reset state thereof, whereby information is written to the selected resistance memory element 200a.

Figure 5:
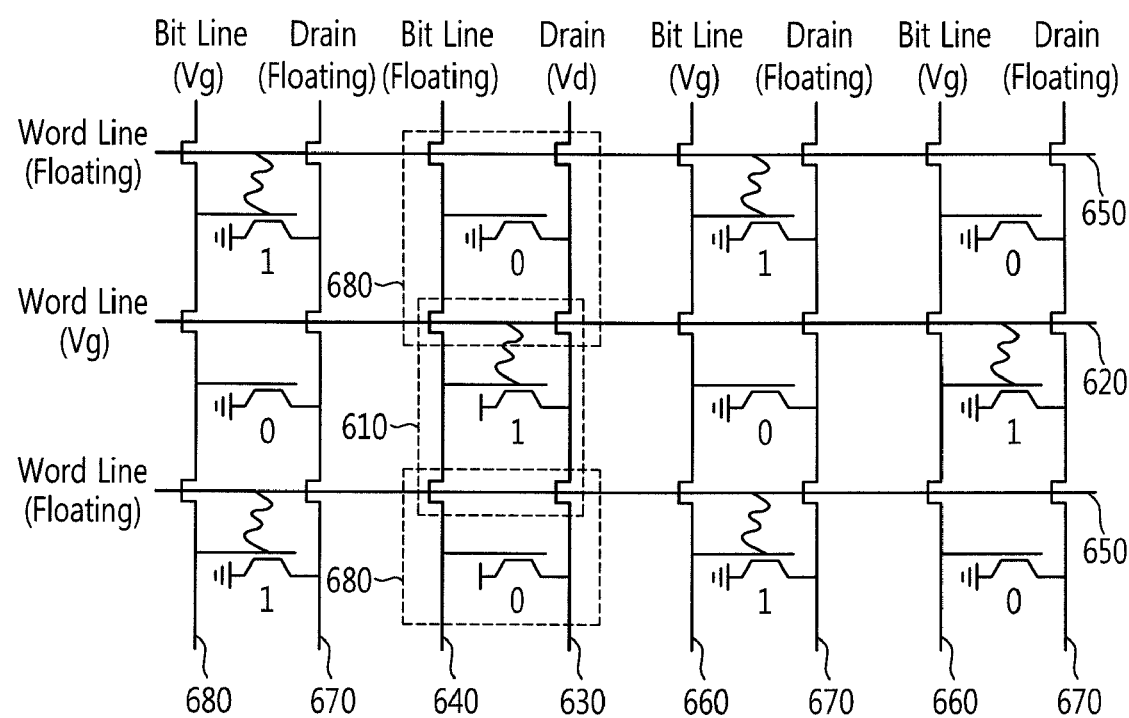
FIG. 5 is a conceptual diagram illustrating an information reading method of the resistance RAM shown in FIG. 4.

FIG. 5 is a diagram illustrating an information reading method of the resistance RAM shown in FIG. 4. FIG. 5 shows voltages applied to read information from a resistance memory element denoted by reference numeral 610.

First, as described above, information is written to the resistance RAM. In FIG. 5, the resistance memory element having a filament shape is in the set state storing "1" and the resistance memory element not having a filament shape is in the reset state storing "0."

In order to read information stored in the selected resistance memory element 610 selected to read information, first, a reference voltage is applied to the source region of the selected resistance memory element 610. Preferably, the source regions of all the resistance memory elements are grounded. The, as shown in FIG. 5, the word line 620 of the selected resistance memory element 610 and the bit lines 660 not belonging to the selected resistance memory element 610 are supplied with the gate voltage Vg. The drain region 630 of the selected resistance memory element 610 is supplied with the drain voltage Vd. The bit line 640 of the selected resistance memory element 610 and the word lines 650 and the drain regions 670 not belonging to the selected resistance memory element 610 are floated. Thereafter, reading current flowing in the drain region 630 of the selected resistance memory element 610 is measured, thereby reading "0" or "1" assigned to the selected resistance memory element 610.

When the voltages are applied as described above, the word line 620 of the selected resistance memory element 610 is supplied with the gate voltage Vg and the bit line 640 thereof is floated. Accordingly, when the resistance switching layer of the selected resistance memory element 610 is in the set state (ON state) as shown in FIG. 5, the gate voltage Vg supplied to the word line 620 is transmitted to the bit line 640. Then, due to the voltage difference between the bit line 640 and the drain region 630, the channel region is opened and current flow in the drain region 630. When the gate voltage Vg is transmitted to the bit line 640 of the selected resistance memory element 610, the channel regions of the resistance memory elements 680 sharing the bit line 640 of the selected resistance memory element 610 are opened and thus current flows in the drain regions 630. When the resistance switching layer of the selected resistance memory element 610 is in the set state, current flows in the drain regions 630 of all the resistance memory elements 610 and 680 arranged in the same column and thus the current is amplified.

On the contrary, when the resistance switching layer of the selected resistance memory element 610 is in the reset state (OFF state), the gate voltage Vg applied to the word line 620 is not transmitted to the bit line 640. Accordingly, current hardly flows in the drain region 630 of the selected resistance memory element 610. Since the gate voltage Vg applied to the word line 620 of the selected resistance memory element 610 is not transmitted to the bit line 640, current does not flow in the drain regions 630 of the resistance memory elements 680 sharing the bit line 640.

As a result, current hardly flows in the drain region 630 of the selected resistance memory element 610 when the resistance switching layer of the selected resistance memory element 610 is in the OFF state, but the current flowing in the drain region 630 is amplified when resistance switching layer of the selected resistance memory element 610 is in the ON state, thereby the ON/OFF current ratio is greatly raised. Accordingly, it is possible to clearly read information from the resistance selected resistance memory element 610.

When the bit lines not belonging to the selected resistance memory element 610 are supplied with the gate voltage Vg and the drain regions 670 not belonging to the selected resistance memory element 610 are floated, current hardly flows in the drain regions 670 of the resistance memory elements disposed in the columns different from the column of the selected resistance memory element 610, thereby not erroneously reading information from the selected resistance memory element 610 due to the adjacent resistance memory elements.

Figure 6:
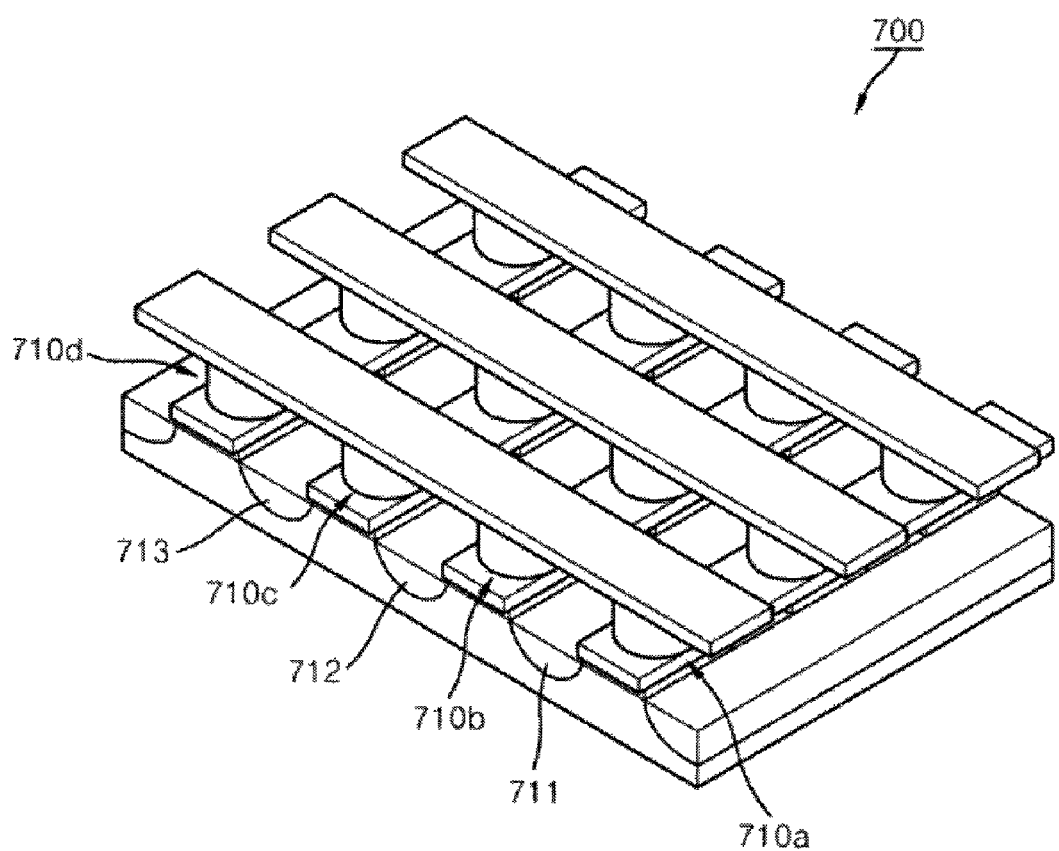
FIG. 6 is a view schematically illustrating a structure of the resistance RAM according to another embodiment of the invention.

FIG. 6 is a diagram illustrating a structure of a resistance RAM according to another embodiment of the invention.

As shown in FIG. 6, the resistance RAM 700 according to this embodiment has substantially the same structure as the resistance RAM 400 shown in FIG. 4. However, similarly to a structure of a NDAN flash memory, a source region of a resistance memory element and drain regions of resistance memory elements adjacent thereto in the row direction are monolithically formed and shared. That is, as shown in FIG. 6, the source region 711 of the resistance memory element denoted by reference numeral 710*a* is shared as the drain region 711 of the resistance memory element denoted by reference numeral 710*b*. Similarly, the source region 712 of the resistance memory element 710*b* is shared as the drain region 712 of the resistance memory element denoted by reference numeral 710*c* and the source region 713 of the resistance memory element 710*c* is shared as the drain region 713 of the resistance memory element denoted by reference numeral 710*d*.

By manufacturing the resistance RAM so that the source region and the drain region of the resistance memory elements adjacent to each other in the row direction, the same degree of integration as the resistance RAM having the known cross bar array structure can be obtained.

A method of writing information to the resistance RAM 700 shown in FIG. 6 is performed by applying the set voltage or reset voltage across the word lines 250 and the bit lines 230, similarly to the method of writing information to the resistance RAM 400 shown in FIG. 4. However, a method of reading information stored in the resistance RAM 700 shown in FIG. 6 is different from the method of reading information stored in the resistance RAM 400 shown in FIG. 4.

Figure 7:
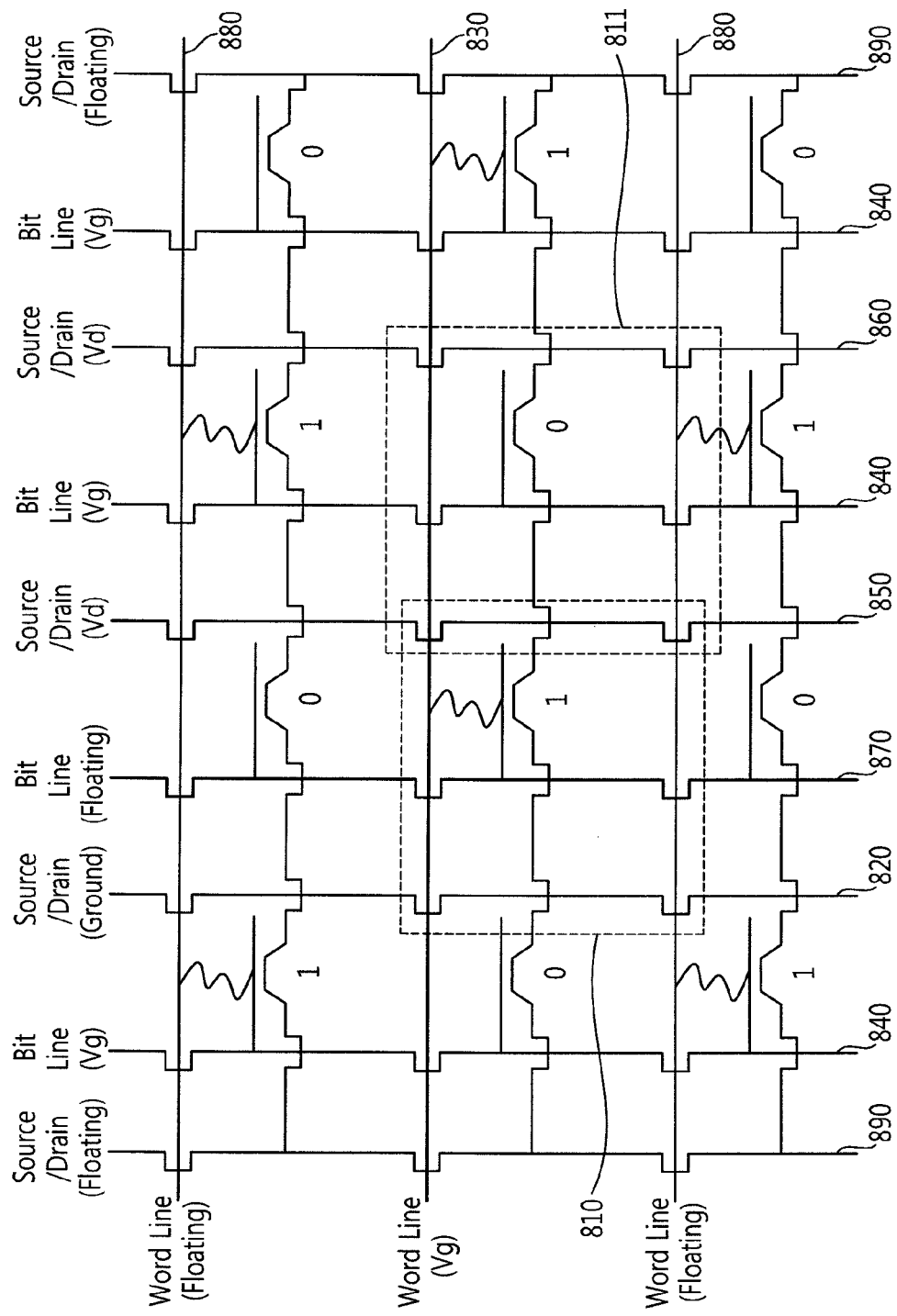
FIG. 7 is a conceptual diagram illustrating an information reading method of the resistance RAM shown in FIG. 6.

FIG. 7 is a diagram illustrating an information reading method of the resistance RAM shown in FIG. 6. FIG. 7 shows voltages applied to read information from a resistance memory element denoted by reference numeral 810.

First, as described above, information is written to the resistance RAM. In FIG. 7, the resistance memory element having a filament shape is in the set state storing "1" and the resistance memory element not having a filament shape is in the reset state storing "0."

In order to read information stored in the selected resistance memory element 810 selected to read information, first, a reference voltage is applied to the source region of the selected resistance memory element 810. Preferably, the source region 820 of the selected resistance memory element 810 is grounded. The, as shown in FIG. 7, the word line 830 of the selected resistance memory element 810 and the bit lines 840 not belonging to the selected resistance memory element 810 are supplied with the gate voltage Vg. The drain region 850 of the selected resistance memory element 810 and the drain region 860 of the resistance memory element 811 sharing the drain region 850 of the selected resistance memory element 810 as a source region 850 are supplied with the drain voltage Vd. The bit line 870 of the selected resistance memory element 810 and the word lines 880 not belonging to the selected resistance memory element 810 are floated. The source and drain regions 890 other than the drain region 850 of the selected resistance memory element 810 and the drain region 860 of the resistance memory element 811 sharing the drain region 850 of the selected resistance memory element 810 as a source region are floated. Thereafter, reading current flowing in the drain region 850 of the selected resistance memory element 810 is measured to read "0" or "1" assigned to the selected resistance memory element 810.

When the voltages are applied as described above, the word line 830 of the selected resistance memory element 810 is supplied with the gate voltage Vg and the bit line 870 thereof is floated. Accordingly, when the resistance switching layer of the selected resistance memory element 810 is in the set state (ON state) as shown in FIG. 7, the gate voltage Vg supplied to the word line 830 is transmitted to the bit line 870. Then, due to the voltage difference between the bit line 870 and the drain region 850, the channel region is opened and current flows in the drain region 850. As shown in FIG. 7, the current flowing in the drain region 850 is amplified when the selected resistance memory element 810 is in the ON state and current hardly flows when the selected resistance memory element is in the OFF state, thereby the ON/OFF current ratio is greatly raised. Accordingly, it is possible to clearly read information from the resistance RAM shown in FIG. 6 by applying the voltages as described above.

However, in the resistance RAM shown in FIG. 6, unlike the resistance RAM 400 shown in FIG. 4, the source regions and the drain regions are shared in the row direction and thus erroneous information may be read. Such a problem is remarkable in the resistance memory element 811 sharing the drain region 850 of the selected resistance memory element 810 as the source region 850. To solve such a problem, the drain voltage Vd is applied to the drain region 860 of the resistance memory element 811. In this way, by applying the drain voltage Vd to the drain region 860 of the resistance memory element 811, the source region 850 and the drain region 860 of the resistance memory element 811 are supplied with the same voltage. Accordingly, current flowing through the source region 850 and the drain region 860 is not effective. That is, the current does not affect the drain region 850 of the selected resistance memory element 810.

In the resistance memory elements other than the resistance memory element 811, current may flow in the source and drain regions 890, but does not affect the drain region 850 of the selected resistance memory element 810. Accordingly, as shown in FIG. 6, when the resistance RAM 700 is constructed so that the source and drain regions of the adjacent resistance memory elements are shared with each other, information is not read erroneously due to the adjacent resistance memory elements at the time of reading information. That is, when the resistance RAM 700 is constructed as shown in FIG. 6, the degree of integration is raised but information is not read erroneously.

A phase change RAM according to another embodiment of the invention has an array structure in which phase change memory elements are arranged in a matrix of rows and columns. The phase change memory elements have the structure similar to that of the resistance memory element 20 shown in FIGS. 2 and 3 as described above. Accordingly, the phase change RAM has a structure similar to those of the resistance RAMs 400 and 700 shown in FIGS. 4 and 6. The difference between the resistance RAM 400 or 700 shown in FIG. 4 or 6 and the phase change RAM is the same as the difference between the resistance memory element 200 shown in FIGS. 2 and 3 and the phase change memory element.

An information writing method and an information reading method of the phase change RAM according to the embodiment of the invention are similar to the methods of writing and reading information to and from the resistance RAM 400 or 700. However, the gate voltage supplied to the word line of the phase change memory element selected to read information and the drain voltage supplied to the drain region are set so that the current flowing in the phase change layer of the selected phase change memory element is smaller than the reset current for changing the phase change layer of the selected phase change memory element from the set state to the reset state. In the information writing method and the information reading method of the phase change RAM, similarly to the information writing method and the information reading method of the resistance RAM, information is written by the use of the word line and the bit line and information is read by measuring current flowing in the drain region.

In the resistance memory element and the phase change memory element according to the embodiments of the invention, since information is written by applying the voltages to the word line and the bit line and information is read by applying the voltages to the word line and the drain region, the portions used to write and read information are separated and thus the memory elements can be clearly driven. By controlling the amount of electric charges of the channel region, a large ON/OFF current ratio can be obtained at the time of reading information.

In the resistance RAM and the phase change RAM according to the embodiments of the invention, as described above, the portions used to write and read information are separated and are not influenced by adjacent memory elements at the time of reading information, whereby the information is not read erroneously.

In the information writing method and the information reading method of the resistance RAM and the phase change RAM according to the embodiments of the invention, when the memory element is in the ON state (set state), the voltage of the word line is transmitted to the bit line and thus the current flowing in the selected memory element and the current flowing in all the memory elements sharing the bit line are together measured, whereby the reading current is greatly raised. On the contrary, when the memory element is in the OFF state (reset state), the voltage of the word line is not transmitted to the bit line and thus only the small current is measured. As a result, since the ON/OFF current ratio is raised, it is possible to clearly read information.

While the exemplary embodiments of the invention have been shown and described, the invention is not limited to the exemplary embodiments. It will be understood by those skilled in the art that the invention can be modified in various forms without departing from the scope of the invention described in the appended claims. The modifications are also within the scope of the invention.

What is claimed is:

1. A resistance memory element comprising:
   a substrate in which a channel region is formed between a source region and a drain region;
   a bit line formed out of a conductive material on the channel region;
   a resistance switching layer, formed out of a material in which an electrical resistance is switched by an electrical signal, directly on the bit line; and
   a word line formed out of a conductive material directly on the resistance switching layer.

2. The resistance memory element according to claim 1, further comprising an insulating layer formed between the channel region and the bit line, wherein the insulating layer is in direct contact with the channel region and the bit line.

3. A phase change memory element comprising:
   a substrate in which a channel region is formed between a source region and a drain region;
   a bit line formed out of a conductive material on the channel region;
   a phase changing layer, formed out of a material in which a phase is changed by an electrical signal, directly on the bit line; and
   a word line formed out of a conductive material directly on the phase changing layer.

4. The phase change memory element according to claim 3, further comprising an insulating layer formed between the channel region and the bit line, wherein the insulating layer is in direct contact with the channel region and the bit line.

5. A resistance random access memory device that is an array of resistance memory elements arranged in a matrix, each resistance memory element comprising:
   a substrate in which a source region and a drain region are formed along a column direction and a channel region is formed between the source region and the drain region;
   a bit line formed out of a conductive material on the channel region, the bit line extending along the column direction;
   a resistance switching layer formed out of a material in which electrical resistance is switched by an electrical signal directly on the bit line; and
   a word line formed out of a conductive material directly on the resistance switching layer, the word line extending along a row direction,
   wherein each resistance memory element shares the source region, the drain region, and the bit line with the resistance memory element adjacent thereto in the column direction, and each resistance memory element shares the word line with the resistance memory element adjacent thereto in the row direction to form the array.

6. The resistance random access memory device according to claim 5, wherein the source region of each resistance memory element and the drain regions of the resistance memory elements adjacent thereto in the row direction are electrically isolated from each other.

7. The resistance random access memory device according to claim 5, wherein the source region of each resistance memory element and the drain regions of the resistance memory elements adjacent thereto in the row direction are formed in a bundle and shared with each other.

8. The resistance random access memory device according to claim 5, wherein each resistance memory element further includes an insulating layer formed between the channel region and the bit line, wherein the insulating layer is in direct contact with the channel region and the bit line.

9. An information reading method of a resistance random access memory device comprising:
preparing the resistance random access memory device that is an array of resistance memory elements arranged in a matrix, each resistance memory element including:
a substrate in which a source region and a drain region are formed along a column direction and a channel region is formed between the source region and the drain region,
a bit line formed out of a conductive material on the channel region, the bit line extending along the column direction,
a resistance switching layer formed out of a material in which electrical resistance is switched by an electrical signal on the bit line, and
a word line formed out of a conductive material on the resistance switching layer, the word line extending along a row direction,
wherein each resistance memory element shares the source region, the drain region, and the bit line with the resistance memory element adjacent thereto in the column direction, and each resistance memory element shares the word line with the resistance memory element adjacent thereto in the row direction to form the array, and wherein the source region of each resistance memory element and the drain regions of the resistance memory elements adjacent thereto in the row direction are electrically isolated from each other;
assigning a value of 1 to the resistance memory element in which the resistance switching layer is in a set state and assigning a value of 0 to the resistance memory element in which the resistance switching layer is in a reset state;
on the basis of a voltage applied to the source region of the resistance memory element selected to read information therefrom, applying a gate voltage to the word line of the selected resistance memory element and the bit lines not belonging to the selected resistance memory element, applying a drain voltage to the drain region of the selected resistance memory element, and floating the bit line of the selected resistance memory element and the word lines not belonging to the selected resistance memory element; and
measuring current flowing in the drain region of the selected resistance memory element to read values of 0 or 1 assigned to the selected resistance memory element.

10. The information reading method according to claim 9, wherein a reference voltage is applied to the source regions not belonging to the selected resistance memory element, and the drain regions not belonging to the selected resistance memory element are floated.

11. The information reading method according to claim 9, wherein a voltage difference between the gate voltage and the drain voltage is smaller than a reset voltage used to switch the resistance switching layer from the set state to the reset state.

12. An information reading method of a resistance random access memory device comprising:
preparing the resistance random access memory device that is an array of resistance memory elements arranged in a matrix, each resistance memory element including:
a substrate in which a source region and a drain region are formed along a column direction and a channel region is formed between the source region and the drain region,
a bit line formed out of a conductive material on the channel region, the bit line extending along the column direction,
a resistance switching layer formed out of a material in which electrical resistance is switched by an electrical signal on the bit line; and
a word line formed out of a conductive material on the resistance switching layer, the word line extending along a row direction,
wherein each resistance memory element shares the source region, the drain region, and the bit line with the resistance memory element adjacent thereto in the column direction, and each resistance memory element shares the word line with the resistance memory element adjacent thereto in the row direction to form the array, and wherein the source region of each resistance memory element and the drain regions of the resistance memory elements adjacent thereto in the row direction are formed in a bundle and shared with each other;
assigning a value of 1 to the resistance memory element in which the resistance switching layer is in a set state and assigning a value of 0 to the resistance memory element in which the resistance switching layer is in a reset state;
on the basis of a voltage applied to the source region of the resistance memory element selected to read information therefrom, applying a gate voltage to the word line of the selected resistance memory element and the bit lines not belonging to the selected resistance memory element, applying a drain voltage to the drain region of the selected resistance memory element and the drain region of the resistance memory element sharing as the source region the drain region of the selected resistance memory element, and floating the bit line of the selected resistance memory element and the word lines not belonging to the selected resistance memory element; and
measuring current flowing in the drain region of the selected resistance memory element to read a value of 0 or 1 assigned to the selected resistance memory element.

13. The information reading method according to claim 12, wherein the source regions and the drain regions not belonging to the selected resistance memory element and the resistance memory element sharing as the source region the drain region of the selected resistance memory element are floated.

14. The information reading method according to claim 12, wherein a voltage difference between the gate voltage and the drain voltage is smaller than a reset voltage used to switch the resistance switching layer from the set state to the reset state.

15. A phase change random access memory device that is an array of phase change memory elements arranged in a matrix, each phase change memory element comprising:
a substrate in which a source region and a drain region are formed along a column direction and a channel region is formed between the source region and the drain region;
a bit line formed out of a conductive material on the channel region, the bit line extending along the column direction;
a phase change layer, formed out of a material in which a phase is changed by an electrical signal, directly on the bit line; and
a word line extending along the row direction, formed out of a conductive material, directly on the phase change layer,
wherein each phase change memory element shares the source region, the drain region, and the bit line with the phase change memory element adjacent thereto in the column direction and shares the word line with the phase change memory element adjacent thereto in the row direction to form the array.

16. The phase change random access memory device according to claim 15, wherein the source region of each phase change memory element and the drain regions of the phase change memory elements adjacent thereto in the row direction are electrically isolated from each other.

17. The phase change random access memory device according to claim 15, wherein the source region of each phase change memory element and the drain regions of the phase change memory elements adjacent thereto in the row direction are formed in a bundle and shared with each other.

18. The phase change random access memory device according to claim 15, wherein each phase change memory element further includes an insulating layer formed between the channel region and the bit line, wherein the insulating layer is in direct contact with the channel region and the bit line.

19. An information reading method of a phase change random access memory device comprising:
    preparing the phase change random access memory device that is an array of phase change memory elements arranged in a matrix, each phase change memory element including:
    a substrate in which a source region and a drain region are formed along a column direction and a channel region is formed between the source region and the drain region,
    a bit line formed out of a conductive material on the channel region, the bit line extending along the column direction,
    a phase change layer, formed out of a material in which a phase is changed by an electrical signal, on the bit line, and
    a word line extending along the row direction, formed out of a conductive material, on the phase change layer,
    wherein each phase change memory element shares the source region, the drain region, and the bit line with the phase change memory element adjacent thereto in the column direction and shares the word line with the phase change memory element adjacent thereto in the row direction to form the array, and wherein the source region of each phase change memory element and the drain regions of the phase change memory elements adjacent thereto in the row direction are electrically isolated from each other;
    assigning a value of 1 to the phase change memory element in which the phase change layer is in a set state and assigning a value of 0 to the phase change memory element in which the phase change layer is in a reset state;
    on the basis of a voltage applied to the source region of the phase change memory element selected to read information therefrom, applying a gate voltage to the word line of the selected phase change memory element and the bit lines not belonging to the selected phase change memory element, applying a drain voltage to the drain region of the selected phase change memory element, and floating the bit line of the selected phase change memory element and the word lines not belonging to the selected phase change memory element; and
    measuring current flowing in the drain region of the selected phase change memory element to read a value of 0 or 1 assigned to the selected phase change memory element.

20. The information reading method according to claim 19, wherein a reference voltage is applied to the source regions not belonging to the selected phase change memory element and the drain regions not belonging to the selected phase change memory element are floated.

21. The information reading method according to claim 19, wherein the gate voltage and the drain voltage are set so that current flowing in the phase change layer is smaller than reset current used to change the phase change layer from the set state to the reset state.

22. An information reading method of a phase change random access memory device comprising:
    preparing the phase change random access memory device that is an array of phase change memory elements arranged in a matrix, each phase change memory element including:
    a substrate in which a source region and a drain region are formed along a column direction and a channel region is formed between the source region and the drain region,
    a bit line formed out of a conductive material on the channel region, the bit line extending along the column direction,
    a phase change layer, formed out of a material in which a phase is changed by an electrical signal, on the bit line, and
    a word line extending along the row direction, formed out of a conductive material, on the phase change layer,
    wherein each phase change memory element shares the source region, the drain region, and the bit line with the phase change memory element adjacent thereto in the column direction and shares the word line with the phase change memory element adjacent thereto in the row direction to form the array, and wherein the source region of each phase change memory element and the drain regions of the phase change memory elements adjacent thereto in the row direction are formed in a bundle and shared with each other;
    assigning a value of 1 to the phase change memory element of which the phase change layer is in a set state and assigning a value of 0 to the phase change memory element of which the phase change layer is in a reset state;
    on the basis of a voltage applied to the source region of the phase change memory element selected to read information therefrom, applying a gate voltage to the word line of the selected phase change memory element and the bit lines not belonging to the selected phase change memory element, applying a drain voltage to the drain region of the selected phase change memory element and the drain region of the phase change memory device sharing as the source region the drain region of the selected phase change memory element, and floating the bit line of the selected phase change memory element and the word lines not belonging to the selected phase change memory element; and
    measuring current flowing in the drain region of the selected phase change memory element to read a value of 0 or 1 assigned to the selected phase change memory element.

23. The information reading method according to claim 22, wherein the source regions and the drain regions not belonging to the selected phase change memory element and the phase change memory element sharing as the source region the drain region of the selected phase change memory element are floated.

24. The information reading method according to claim 22, wherein the gate voltage and the drain voltage are set so that current flowing in the phase change layer is smaller than reset current used to change the phase change layer from the set state to the reset state.

* * * * *